(12) United States Patent
Mouridsen (10) Patent No.: US 11,050,338 B2
(45) Date of Patent: Jun. 29, 2021

(54) DETECTION OF SHOOT-THROUGH IN POWER CONVERTERS

(71) Applicant: SCHNEIDER ELECTRIC IT CORPORATION, West Kingston, RI (US)

(72) Inventor: Jonas Sonsby Mouridsen, Odense V (DK)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 21 days.

(21) Appl. No.: 16/205,684

(22) Filed: Nov. 30, 2018

(65) Prior Publication Data

US 2020/0177069 A1   Jun. 4, 2020

(51) Int. Cl.

| | |
|---|---|
| H02M 1/08 | (2006.01) |
| G01R 19/04 | (2006.01) |
| G01R 19/10 | (2006.01) |
| G01R 31/42 | (2006.01) |
| H02J 9/06 | (2006.01) |
| H02M 1/42 | (2007.01) |
| H02M 5/458 | (2006.01) |
| H02M 7/537 | (2006.01) |

(52) U.S. Cl.
CPC ............ *H02M 1/08* (2013.01); *G01R 19/04* (2013.01); *G01R 19/10* (2013.01); *G01R 31/42* (2013.01); *H02J 9/06* (2013.01); *H02M 1/4216* (2013.01); *H02M 5/4585* (2013.01); *H02M 7/537* (2013.01)

(58) Field of Classification Search
CPC .......... G01R 19/04; G01R 19/10; H02J 9/06; H02M 1/4216; H02M 5/4585; H02M 7/537

USPC .................................................. 307/64, 65
See application file for complete search history.

(56) References Cited

U.S. PATENT DOCUMENTS

| | | | |
|---|---|---|---|
| 9,979,313 B2 | 5/2018 | Mouridsen | |
| 2013/0003429 A1 | 1/2013 | Murahashi | |
| 2017/0149346 A1* | 5/2017 | Mouridsen | H02M 5/4585 |
| 2018/0234016 A1* | 8/2018 | Acar | H02M 3/158 |
| 2019/0067932 A1* | 2/2019 | Li | H02M 1/08 |
| 2020/0169163 A1* | 5/2020 | Nielsen | H02M 5/458 |

OTHER PUBLICATIONS

Extended European Search Report from corresponding European Application No. 19208691.6 dated Dec. 18, 2019.

\* cited by examiner

*Primary Examiner* — Michael R. Fin
(74) *Attorney, Agent, or Firm* — Lando & Anastasi, LLP (57) ABSTRACT

According to one aspect, an uninterruptible power supply system is provided including an input configured to receive input power, an interface configured to be coupled to a backup power supply and to receive backup power from the backup power supply, an output configured to provide output power derived from at least one of the input power and the backup power to a load, a power converter coupled to the input, a capacitor, and a shoot-through detector coupled to the capacitor. The shoot-through detector is configured to obtain a first voltage value indicative of a first voltage across the capacitor, obtain a second voltage value indicative of a second voltage across the capacitor, compare the first voltage value to the second voltage value, determine, based on the comparison, that the capacitor is experiencing a shoot-through condition, and provide an output signal indicative of the shoot-through condition.

11 Claims, 6 Drawing Sheets

DETECTION OF SHOOT-THROUGH IN POWER CONVERTERS

BACKGROUND OF THE INVENTION

1. Field of the Invention

At least one example in accordance with the present invention relates generally to detecting and correcting semiconductor shoot-through in power converters.

2. Discussion of Related Art

The use of power devices, such as Uninterruptible Power Supplies (UPSs), to provide regulated, uninterrupted power for sensitive and/or critical loads, such as computer systems and other data processing systems, is known. Known UPSs include online UPSs, offline UPSs, line-interactive UPSs, as well as others. Online UPSs provide conditioned AC power as well as back-up AC power upon interruption of a primary source of AC power. Offline UPSs typically do not provide conditioning of input AC power, but do provide back-up AC power upon interruption of the primary AC power source. Line-interactive UPSs are similar to offline UPSs in that they switch to battery power when a blackout occurs but also typically include a multi-tap transformer for regulating the output voltage provided by the UPS.

SUMMARY

According to at least one aspect of the present invention, an Uninterruptible Power Supply (UPS) system is provided including an input configured to receive input power, an interface configured to be coupled to a backup power supply and to receive backup power from the backup power supply, an output configured to provide output power derived from at least one of the input power and the backup power to a load, a power converter coupled to the input, at least one capacitor, and a shoot-through detector coupled to the at least one capacitor and being configured to: obtain a first voltage value indicative of a first voltage across the at least one capacitor, obtain a second voltage value indicative of a second voltage across the at least one capacitor, compare the first voltage value to the second voltage value, determine, based on the comparison, that the at least one capacitor is experiencing a shoot-through condition, and provide an output signal indicative of the shoot-through condition.

In one embodiment, the shoot-through detector comprises a delay circuit configured to delay the first voltage value by a delay period to generate a delayed first voltage value. In some embodiments, the delay period is within a range of approximately 1-2 microseconds. In at least one embodiment, the shoot-through detector further comprises a comparator having: a first input configured to receive the delayed first voltage value, a second input configured to receive the second voltage value, and an output configured to output a signal indicative of a shoot-through condition responsive to determining that the second voltage value is greater than the first voltage value.

In one embodiment, the shoot-through detector further comprises a logic circuit configured to: receive, from the output of the comparator, the output signal indicative of the shoot-through condition, and output, responsive to receiving the output signal for at least a threshold amount of time, a shoot-through signal indicative of the shoot-through condition. In an embodiment, the logic circuit is further configured to receive a parameter configuration value to set the threshold amount of time. In some embodiments, the threshold amount of time is approximately 500 nanoseconds.

In at least one embodiment, the shoot-through detector further comprises a peak detection and hold circuit configured to receive the first voltage, detect a peak of the first voltage, and hold the peak of the first voltage, the peak of the first voltage corresponding to the first voltage value. In some embodiments, the UPS system further includes a controller coupled to the shoot-through detector, wherein the shoot-through detector is further configured to provide the output signal to the controller, and wherein the controller is configured to control at least one switching device coupled to the at least one capacitor to be in an open and non-conducting position in response to receiving the output signal.

A method of detecting a shoot-through condition in a capacitor is provided, the method comprising acts of obtaining a first voltage value, the first voltage value being indicative of a first voltage across the capacitor, obtaining a second voltage value, the second voltage value being indicative of a second voltage across the capacitor, comparing the first voltage value to the second voltage value, determining, based on the comparison, that the capacitor is experiencing a shoot-through condition, and outputting an output signal indicative of the shoot-through condition.

In an embodiment, obtaining the second voltage value includes obtaining the second voltage value after a delay period from a time at which the first voltage value is obtained. In at least one embodiment, the method further includes mitigating, responsive to outputting the output signal, the shoot-through condition. In some embodiments, mitigating the shoot-through condition includes controlling at least one switching device coupled with the capacitor to be in an open and non-conducting state. In at least one embodiment, determining that the capacitor is experiencing a shoot-through condition includes determining that the second voltage value exceeds the first voltage value by at least a threshold amount for a threshold period of time.

In one embodiment, the method includes receiving, from a user, a configuration parameter corresponding to the threshold amount. In some embodiments, the method includes receiving, from a user, a configuration parameter corresponding to the threshold period of time. In at least one embodiment, the threshold period of time is approximately 500 nanoseconds. In an embodiment, obtaining the first voltage value includes detecting a peak of the first voltage and holding the peak of the first voltage.

According to one aspect, an Uninterruptible Power Supply (UPS) system is provided comprising an input configured to receive input power, an output configured to provide output power to at least one load, at least one capacitor coupled to at least one switching device, and means for identifying, based on a first voltage across the at least one capacitor and a second voltage across the at least one capacitor, a shoot-through condition in the at least one capacitor. In one embodiment, the UPS system further includes means for operating the at least one switching device to mitigate the shoot-through condition.

BRIEF DESCRIPTION OF THE DRAWINGS

Various aspects of at least one embodiment are discussed below with reference to the accompanying figures, which are not intended to be drawn to scale. The figures are included to provide an illustration and a further understanding of the various aspects and embodiments, and are incorporated in and constitute a part of this specification, but are not intended as a definition of the limits of any particular embodiment. The drawings, together with the remainder of the specification, serve to explain principles and operations of the described and claimed aspects and embodiments. In the figures, each identical or nearly identical component that is illustrated in various figures is represented by a like numeral. For purposes of clarity, not every component may be labeled in every figure. In the figures:

DETAILED DESCRIPTION OF THE INVENTION

Examples of the methods and systems discussed herein are not limited in application to the details of construction and the arrangement of components set forth in the following description or illustrated in the accompanying drawings. The methods and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are no intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

Certain power devices, such as Uninterruptible Power Supplies (UPSs), may include power conditioning circuitry. The power conditioning circuitry may include two or more semiconductor switching devices coupled in series with a capacitor. If the semiconductors are simultaneously turned on or if a conductive path through the semiconductors is otherwise available, the capacitor may rapidly discharge through the semiconductors in a phenomenon known in the art as "shoot-through." Shoot-through may be considered disadvantageous in certain situations as it can damage one or more components in the UPS.

Shoot-through may occur intentionally or unintentionally. For example, unintentional shoot-through may be caused by a faulty semiconductor device, gate driver, or control signal. Although many semiconductors are rated to withstand shoot-through for several microseconds, during which time the current through the semiconductor is limited by the saturation of the semiconductors, inadvertent shoot-through may nonetheless be considered disadvantageous at least in part because of voltage stress placed on various components. Accordingly, it may be advantageous to be able to detect and mitigate shoot-through without substantially increasing the size and cost of the power device in which the at least one capacitor is implemented.

Figure 1:
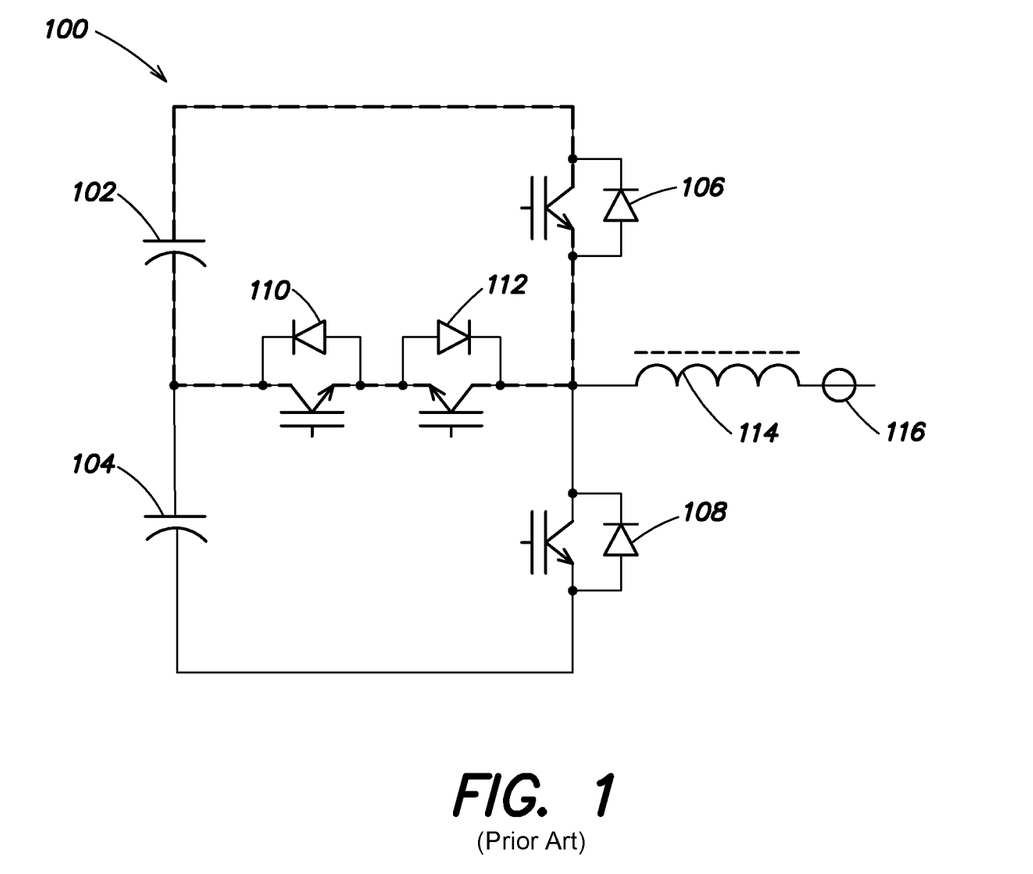
FIG. 1 illustrates a conventional three-level inverter.

FIG. 1 illustrates a conventional three-level inverter 100. The inverter 100 may be implemented in an Uninterruptible Power Supply (UPS), for example. The inverter 100 includes a first DC capacitor 102, a second DC capacitor 104, a first semiconductor 106, a second semiconductor 108, a third semiconductor 110, a fourth semiconductor 112, an inverter choke 114, and an output current sensor 116.

Shoot-through may occur in the inverter 100 if the first DC capacitor 102 or the second DC capacitor 104 is short circuited. For example, if the first semiconductor 106 and the fourth semiconductor 112 are simultaneously turned on and conducting, the first DC capacitor 102 may discharge through a path including the first DC capacitor 102, the first semiconductor 106, the fourth semiconductor 112, and a diode coupled in parallel with the third semiconductor 110.

In some conventional solutions, an advanced gate driver in combination with a voltage sensor is implemented to detect and mitigate shoot-through. For example, the advanced gate driver may measure the voltage across the first semiconductor 106 and, if the voltage exceeds a preset threshold value (for example, approximately 7 V), the advanced gate driver may turn off the first semiconductor 106 to prevent or limit a current through the first semiconductor 106, thereby terminating the shoot-through condition. However, advanced gate drivers may be costly, complex, and physically large, particularly as a number of semiconductors that need to be driven increases.

In light of the foregoing, a system is provided to detect and mitigate shoot-through without prohibitively increasing cost, complexity, and physical footprint. A relatively simple circuit is implemented to measure a capacitor voltage value, hold the measured voltage value, and compare the measured voltage value to a subsequently measured capacitor voltage value after a delay. Responsive to detecting a shoot-through condition based on the comparison of the delayed voltage value to the newly-measured voltage value, the circuit may be configured to turn off one or more semiconductors to prevent or mitigate the shoot-through condition.

At least one embodiment described herein is directed to a three-level Uninterruptible Power Supply (UPS) topology, the details of which are described in greater detail, for example, in U.S. patent application Ser. No. 15/320,622, titled "3-LEVEL POWER TOPOLOGY" and filed Jun. 27, 2014, which is hereby incorporated by reference in its entirety. Furthermore, the system described herein may be applied in other UPS topologies or power systems.

Figure 2:
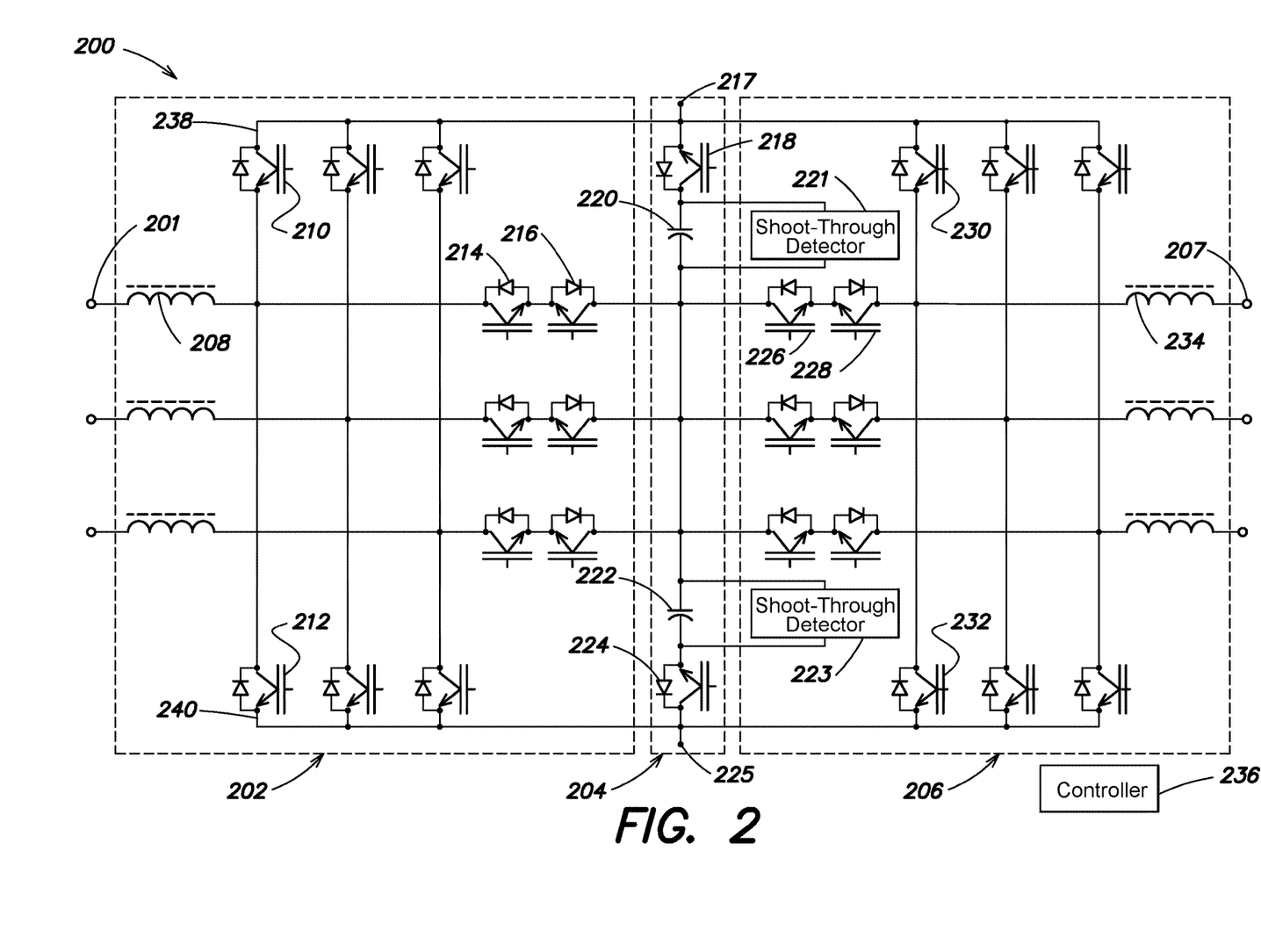
FIG. 2 illustrates a three-level converter according to one embodiment.

FIG. 2 is a schematic diagram of a three-level power converter 200 according to one embodiment described herein. The three-level inverter 200 includes three power conversion branches, each of which operates similarly in certain embodiments. For example, the three-level power converter 200 may be configured to receive three-phase power, and provide each phase of the three-phase power to a respective branch of the three branches. For clarity of illustration, certain components of a first branch of the three branches will be specifically identified. Other branches may include similar components which operate similarly.

The three-level power converter 200 includes a first input 201, a Power Factor Correction (PFC) portion 202, a Direct Current (DC) link portion 204, an inverter portion 206, and a first output 207. The PFC portion 202 includes an input inductor 208, a first switch 210, a second switch 212, a third switch 214, and a fourth switch 216. The DC link portion 204 includes a first backup power supply node 217, a fifth switch 218, a first capacitor 220, a first shoot-through detector 221, a second capacitor 222, a second shoot-through detector 223, a sixth switch 224, and a second backup power supply node 225. The inverter portion 206 includes a seventh switch 226, an eighth switch 228, a ninth switch 230, a tenth switch 232, and an output inductor 234. The PFC portion 202, the DC link portion 204, and the inverter portion 206 collectively include a first DC bus 238 and a second DC bus 240.

According to one embodiment, the first switch 210 and the second switch 212 are 1200V Insulated-Gate Bipolar Transistors (IGBT); however, in other embodiments, the switches 210, 212 may be rated differently or different types of switches may be utilized (for example, the switches 210, 212 can be replaced with diodes if uni-directional power conversion in the PFC portion 202 is sufficient). In one embodiment, the ninth switch 230 and the tenth switch 232 are 1200V IGBTs; however, in other embodiments, the switches 230, 232 may be rated differently or different types of switches may be utilized.

In one embodiment, the third switch 214, fourth switch 216, seventh switch 226, and eighth switch 228 are 600V IGBTs; however, in other embodiments, the switches 214, 216, 226, 228 may be rated differently or different types of switches may be utilized. Each of the switches 210-216, 226-232 may include an internal diode coupled between its collector and emitter. According to one embodiment, the fifth switch 218 and sixth switch 224 are 600V Metal-Oxide-Semiconductor Field-Effect Transistors (MOSFETs); however, in other embodiments, the switches 218, 224 may be rated differently or different types of switches (for example, IGBTs) may be utilized. Where the switches 218, 224 are implemented as MOSFETs, each of the switches 218, 224 may include an internal diode coupled between its drain and source.

The first input 201 is configured to be coupled to a 3-phase power source (for example, a mains power supply) and is coupled to the input inductor 208. A first terminal of the input inductor 208 is coupled to the first input 201, and a second terminal of the input inductor 208 is coupled to the emitter of the first switch 210, the collector of the second switch 212, and the collector of the third switch 214. The collector of the first switch 210 is coupled to the first DC bus 238. The emitter of the first switch 210 is coupled to the input inductor 208, the collector of the second switch 212, and the collector of the third switch 214.

The collector of the second switch 212 is coupled to the input inductor 208, the emitter of the first switch 210, and the collector of the third switch 214. The emitter of the second switch 212 is coupled to the second DC bus 240. The collector of the third switch 214 is coupled to the input inductor 208, the emitter of the first switch 210, and the collector of the second switch 212. The emitter of the third switch 214 is coupled to the emitter of the fourth switch 216. The emitter of the fourth switch 216 is coupled to the emitter of the third switch 214. The collector of the fourth switch 216 is coupled to the first capacitor 220, the second capacitor 222, and the collector of the seventh switch 226.

The source of the fifth switch 218 is coupled to the first DC bus 238. The drain of the fifth switch 218 is coupled to the first capacitor 220. The first capacitor 220 is coupled to the drain of the fifth switch 218 at a first connection, and is coupled to the collector of the fourth switch 216, the second capacitor 222, and the collector of the seventh switch 226 at a second connection. The first capacitor 220 is further coupled in parallel with the first shoot-through detector 221. The second capacitor 222 is coupled to the first capacitor 220, the collector of the fourth switch 216, and the collector of the seventh switch 226 at a first connection, and is coupled to the source of the sixth switch 224 at a second connection.

The second capacitor 222 is further configured to be coupled in parallel with the second shoot-through detector 223. The source of the sixth switch 224 is coupled to the second capacitor 222, and the drain of the sixth switch 224 is coupled to the second DC bus 240. The collector of the seventh switch 226 is coupled to the first capacitor 220, the collector of the fourth switch 216, and the second capacitor 222. The emitter of the seventh switch 226 is coupled to the emitter of the eighth switch 228. The emitter of the eighth switch 228 is coupled to the emitter of the seventh switch 226. The collector of the eighth switch 228 is coupled to the emitter of the ninth switch 230, the collector of the tenth switch 232, and the output inductor 234.

The collector of the ninth switch 230 is coupled to the first DC bus 238, and the emitter of the ninth switch 230 is coupled to the collector of the eighth switch 228, the collector of the tenth switch 232, and the output inductor 234. The collector of the tenth switch 232 is coupled to the collector of the eighth switch 228, the emitter of the ninth switch 230, and the output inductor 234. The emitter of the tenth switch 232 is coupled to the second DC bus 240. The output inductor 234 is coupled to the collector of the eighth switch 228, the emitter of the ninth switch 230, and the collector of the tenth switch 232 at a first connection, and is coupled to the first output 207 at a second connection. The first output 207 is coupled to the output inductor 234, and is configured to be coupled to one or more loads.

The controller 236 is configured to be communicatively coupled to a respective control terminal of one or more of the switches 210, 212, 214, 216, 218, 224, 226, 228, 230, 232. The first DC bus 238 is coupled to the collector of the first switch 210, the source of the fifth switch 218, the collector of the ninth switch 230, and the first backup power supply node 217. The second DC bus 240 is coupled to the emitter of the second switch 212, the drain of the sixth switch 224, the emitter of the tenth switch 232, and the second backup power supply node 225.

In some embodiments, the three-level power converter 200 may be configured to receive input power, convert the input power, and provide the converted power to an output. For example, the three-level power converter 200 may receive three-phase input power from a power supply, such as a mains power supply. One phase of the three-phase power may be received at the first input 201, converted, and provided to the first output 207. Alternatively or in addition, the three-level power converter 200 may receive backup power from at least one backup power supply via the first backup power supply node 217 and/or the second backup power supply node 225. For example, the at least one backup power supply may be a DC battery configured to provide DC power.

Operation of the three-level power converter 200 is described in greater detail below with respect to the normal mode of operation, and more particularly, with respect to a positive portion of an input waveform received at the first input 201. The positive portion of the input waveform is described for exemplary purposes only, and similar principles may apply with respect to the negative portion of the input waveform received at the first input 201.

Continuing with the example above, one phase of the three-phase input power may be received at the first input 201. The controller 236 operates the first switch 210 and the third switch 214 as a boost converter to convert the one phase of the three-phase input power into converted DC power. The controller 236 also operates the first switch 210 and the third switch 214 to provide power factor correction at the first input 201. The converted DC power is provided to the first DC bus 238. The ninth switch 230 is operated by the controller 236 to convert DC power from the first DC bus 238 into regulated AC power. The regulated AC power is provided to the first output 207 via the output inductor 234.

In the backup mode of operation, the three-level power converter 200 operates similarly to the normal mode of operation except that, in some embodiments, the three-level power converter 200 receives energy via one or both of the first backup power supply node 217 and the second backup power supply node 225 during the backup mode of operation. For example, the three-level power converter 200 may receive energy from at least one backup power supply coupled to the first backup power supply node 217 and/or the second backup power supply node 225. The energy received from the at least one backup power supply may be provided at least in part to the inverter portion 206 which may, in turn, process the energy to produce an inverted AC output.

In some embodiments, the at least one backup power supply coupled to the first backup power supply node 217 and/or the second backup power supply node 225 is charged by the three-level power converter 200 via the first backup power supply node 217 and/or the second backup power supply node 225. Accordingly, the first backup power supply node 217 and the second backup power supply node 225 may be referred to herein as power interfaces configured to exchange power between the three-level power converter 200 and the at least one backup power supply.

The first capacitor 220 and the second capacitor 222 may be prone to a shoot-through condition. As discussed above, shoot-through may occur if a capacitor is inadvertently short circuited. For example, the first capacitor 220 or the second capacitor 222 may experience shoot-through if the first capacitor 220 or the second capacitor 222 is short circuited. Using the first capacitor 220 as an example, a shoot-through condition may occur if the fifth switch 218, the ninth switch 230, and the eighth switch 228 are simultaneously in a closed and conducting position (i.e., a "turned on" position). As discussed above, shoot-through may occur unintentionally if, for example, the fifth switch 218, the ninth switch 230, and the eighth switch 228 are simultaneously in a closed and conducting position due to a faulty semiconductor device, gate driver, or control signal.

The first shoot-through detector 221 is configured to detect a shoot-through condition of the first capacitor 220, and the second shoot-through detector 223 is configured to detect a shoot-through condition of the second capacitor 222. If the first shoot-through detector 221 and/or the second shoot-through detector 223 detects a shoot-through condition, the first shoot-through detector 221 and/or the second shoot-through detector 223 may be configured to communicate one or more signals to terminate or mitigate the shoot-through condition.

For example, because the fifth switch 218 is coupled in series with the first capacitor 220 and the sixth switch 224 is coupled in series with the second capacitor 222, the first capacitor 220 and the second capacitor 222 discharge through the fifth switch 218 and the sixth switch 224, respectively. In one embodiment, if the first shoot-through detector 221 and/or the second shoot-through detector 223 detects a shoot-through condition, the first shoot-through detector 221 and/or the second shoot-through detector 223 may communicate one or more signals to the controller 236.

The controller 236 may be configured to control one or more switching devices in response to receiving the one or more signals from the shoot-through detectors 221, 223. For example, controlling the one or more switching devices may include controlling the fifth switch 218 and/or the sixth switch 224 to enter an open and non-conducting state (i.e., a "turned off" state) to prevent the first capacitor 220 and/or the second capacitor 222 from continuing to discharge. In alternate embodiments, the shoot-through detectors 221, 223 may directly control the one or more switching devices without communicating with the controller 236.

Figure 3:
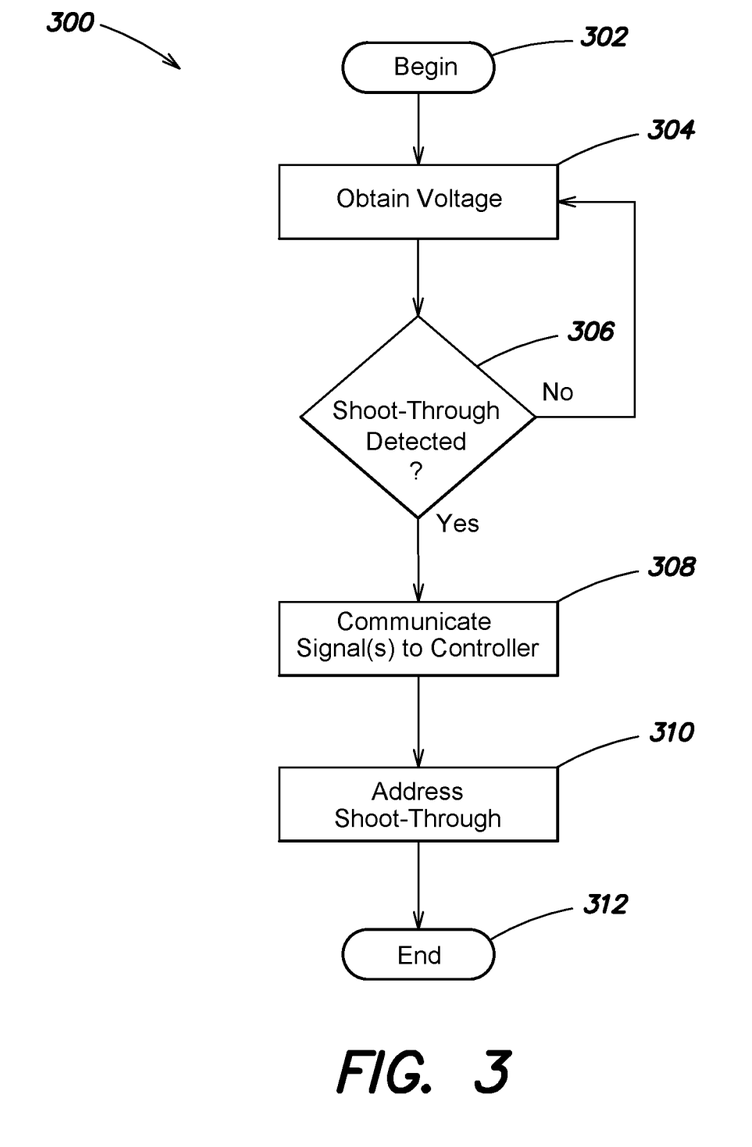
FIG. 3 illustrates a process of eliminating or mitigating capacitor shoot-through according to one embodiment.

FIG. 3 illustrates a process 300 of mitigating or eliminating shoot-through in at least one capacitor. For example, the process 300 may be executed at least partially by one or more of the first shoot-through detector 221, the second shoot-through detector 223, and the controller 236. The process 300 includes acts of obtaining a capacitor voltage value, determining if a shoot-through condition is detected, communicating control signals to a controller, and addressing the shoot-through condition.

Figure 4:
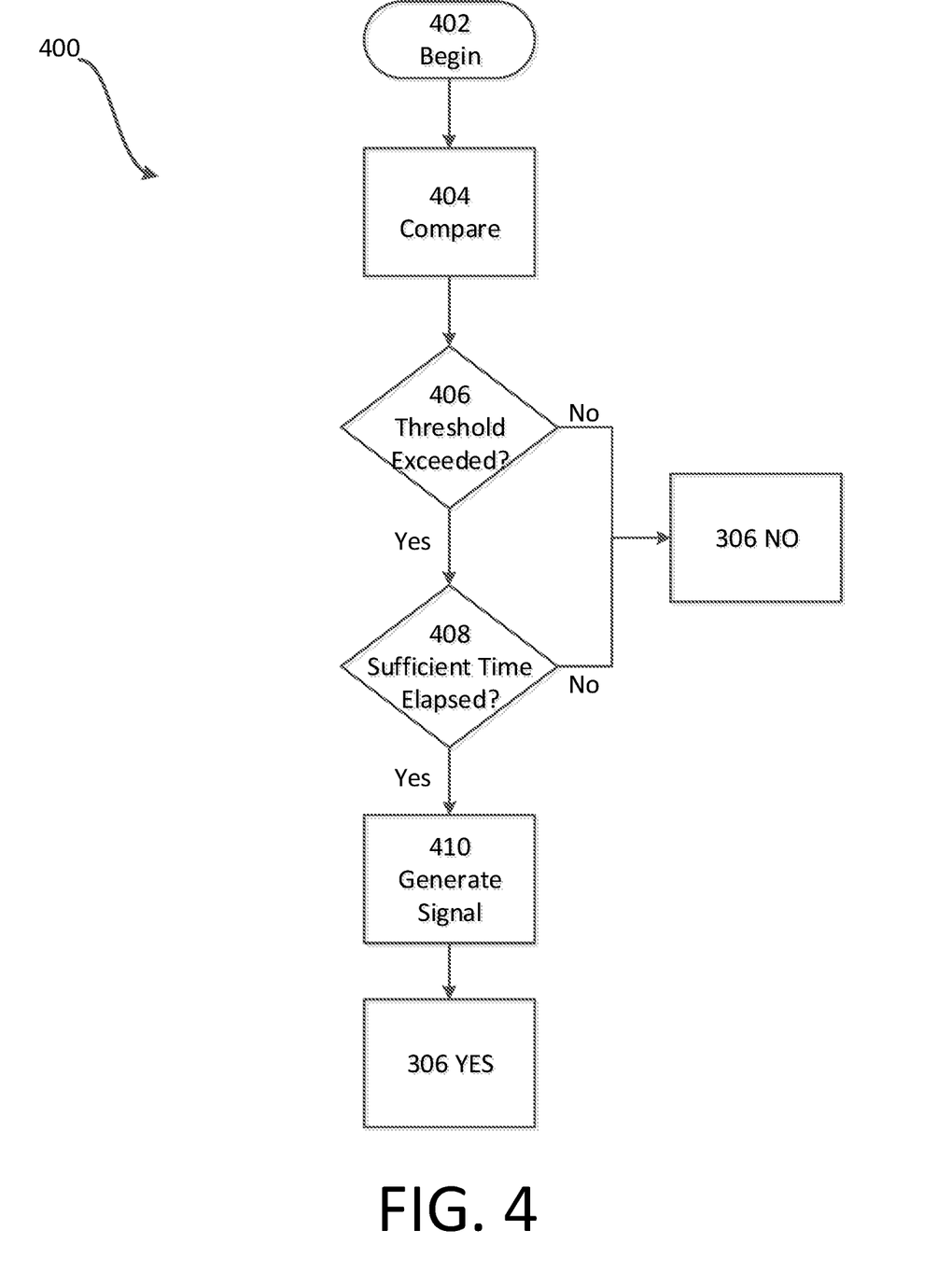
FIG. 4 illustrates a process of detecting capacitor shoot-through according to one embodiment.

At act 302, the process 300 begins. At act 304, a voltage value of a capacitor is obtained. For example, the first shoot-through detector 221 may sample a voltage level of the first capacitor 220 to obtain the voltage value. At act 306, a determination is made as to whether a shoot-through condition is detected. One embodiment of act 306 is discussed in greater detail below with respect to FIG. 4. As shown in FIG. 4, a shoot-through condition of a capacitor is detected where a voltage across the capacitor quickly decreases for an extended period of time.

If a shoot-through condition is not detected (306 NO), then the process 300 returns to act 304. Otherwise, if a shoot-through condition is detected (306 YES), then the process 300 continues to act 308. At act 308, responsive to determining that a shoot-through condition is detected, control signals are communicated to a controller. For example, if the first shoot-through detector 221 determines that the first capacitor 220 is experiencing a shoot-through condition, then the first shoot-through detector 221 may communicate a signal to the controller 236 indicating that the first capacitor 220 is experiencing a shoot-through condition.

At act 310, a detected shoot-through condition is addressed. For example, addressing a shoot-through condition in the first capacitor 220 may include controlling, by the controller 236, the fifth switch 218 to enter an open and non-conducting position. In alternate embodiments, the first shoot-through detector 221 may control the fifth switch 218 directly, without interacting with the controller 236. As discussed above, controlling the fifth switch 218 to enter an open and non-conducting position may mitigate or eliminate shoot-through by open-circuiting the first capacitor 220, because the first capacitor 220 is coupled in series with the fifth switch 218.

Addressing the shoot-through condition at act 310 may include additional actions. For example, the controller 236 may trigger an alarm indicative of the shoot-through condition. Triggering the alarm may include one or more actions which alert a human operator to the shoot-through condition. For example, triggering the alarm may include sending a notification to the human operator, illuminating a Light-Emitting Diode (LED), sounding an audible alarm, and so forth. At act 312, the process 300 ends.

FIG. 4 illustrates a process 400 of detecting a shoot-through condition according to an embodiment. For example, the process 400 may illustrate an example of act 306 of the process 300 in greater detail. The process 400 may be executed by a shoot-through detector, such as the first shoot-through detector 221 or the second shoot-through detector 223. The process 400 includes acts of comparing an instantaneous capacitor voltage to a previously obtained capacitor voltage, determining if a voltage threshold has been exceeded, determining if a sufficient amount of time has elapsed, and generating a detection signal.

At act 402, the process 400 begins. At act 404, an instantaneous capacitor voltage is compared to a previously-sampled capacitor voltage. For example, the previously sampled capacitor voltage may be a peak voltage acquired by a capture-and-hold circuit which has been delayed by a period of time. In some embodiments, the previously sampled peak voltage may be held and delayed for approximately 1-2 µs before being compared to an instantaneous voltage.

At act 406, a determination is made as to whether a criterion is satisfied. For example, the first shoot-through detector 221 may determine if an instantaneous voltage exceeds the delayed peak voltage measurement by more than a threshold amount. The threshold amount may be expressed relative to the delayed peak voltage measurement (for example, expressed as a percentage of the delayed peak voltage measurement) or otherwise (for example, expressed as a fixed voltage value). If the criterion has not been satisfied (406 NO), then no shoot-through condition is detected (306 NO) and the process 400 ends by returning to 306 NO of the process 300. Otherwise (406 YES), the process 400 continues to act 408.

At act 408, a determination is made as to whether a sufficient amount of time has elapsed. For example, the first shoot-through detector 221 may determine if the instantaneous voltage has continuously exceeded the delayed peak voltage measurement by more than a threshold amount for a threshold period of time. In one example, the threshold amount of time may be approximately 500 ns. If the instantaneous voltage has not continuously exceeded the delayed peak voltage measurement for a threshold amount of time (408 NO), then no shoot-through condition is detected (306 NO) and the process 400 ends by returning to 306 NO of the process 300. Otherwise (408 YES), the process 400 continues to act 410. At act 410, a shoot-through detection signal is generated. For example, the first shoot-through detector 221 may generate a signal indicating that the first capacitor 220 is experiencing a shoot-through condition (306 YES). The process 400 ends by returning to 306 YES of the process 300.

Figure 5:
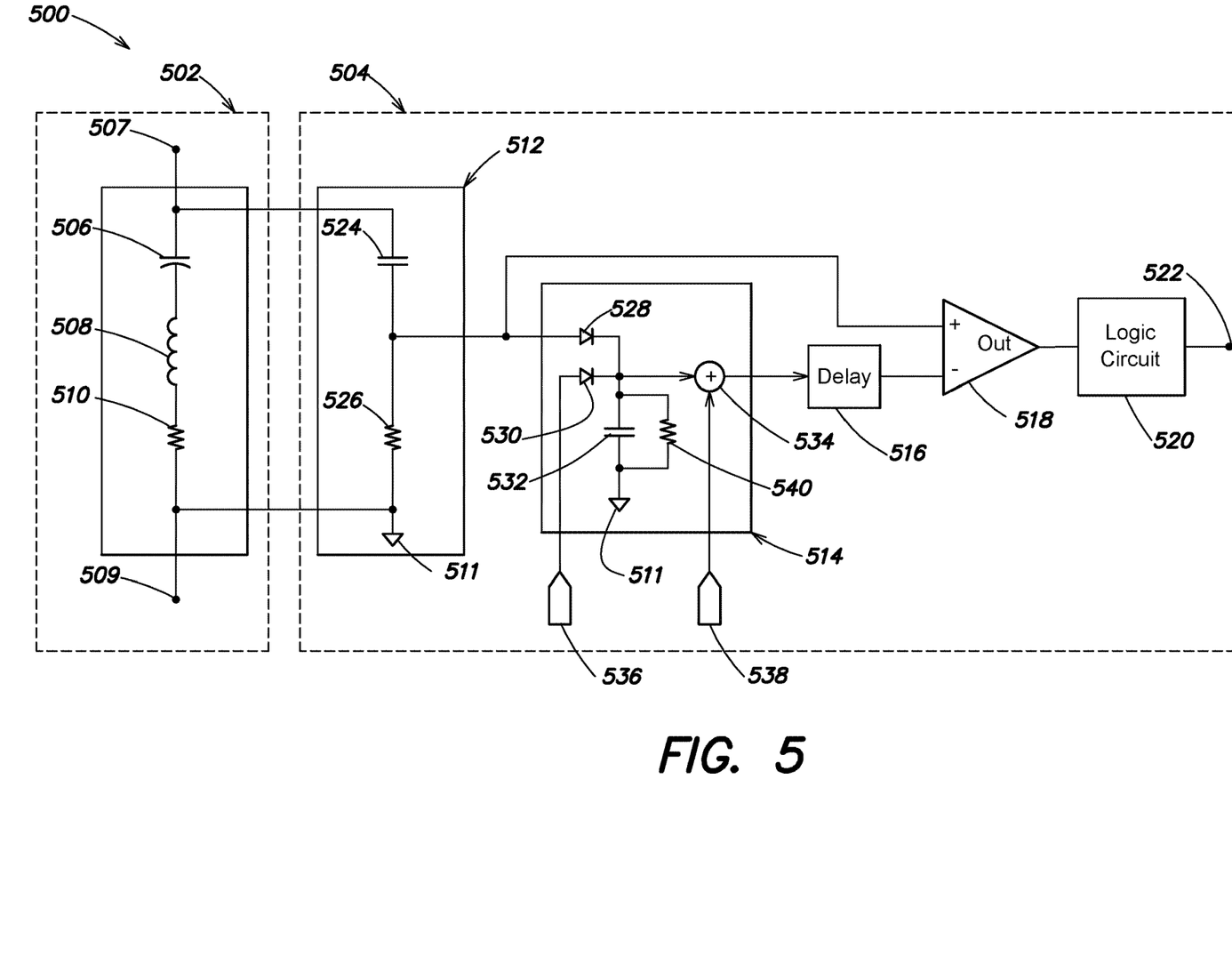
FIG. 5 illustrates a shoot-through detection circuit according to one embodiment.

FIG. 5 illustrates a schematic diagram of a shoot-through detection circuit 500 according to at least one embodiment. The shoot-through detection circuit 500 includes a capacitor 502 and a shoot-through detector 504. In some embodiments, the capacitor 502 may illustrate an embodiment of the first capacitor 220 or the second capacitor 222, and the shoot-through detector 504 may illustrate an embodiment of the first shoot-through detector 221 or the second shoot-through detector 223. As discussed in greater detail below, the shoot-through detector 504 may be configured to detect a shoot-through condition across the capacitor 502 based at least in part on a voltage across the capacitor 502.

The capacitor 502 is illustrated as an equivalent circuit including an ideal capacitor 506, an ideal inductor 508, and an equivalent series resistor 510. As will be appreciated by one of ordinary skill in the art, the ideal capacitor 506, the ideal inductor 508, and the equivalent series resistor 510 are not physical, discrete components, and are illustrated as separate components for clarity of explanation only. The capacitor 502 further includes a first connection 507 and a second connection 509 configured to be coupled to one or more external components (not illustrated).

The shoot-through detector 504 includes a blocking and sensing circuit 512, a peak detection and hold circuit 514, a delay circuit 516, a comparator 518, a logic circuit 520, and an output 522. The blocking and sensing circuit 512 includes a DC blocking capacitor 524 and a resistor 526. The peak detection and hold circuit 514 includes a first diode 528, a second diode 530, a capacitor 532, an adder 534, and a resistor 540, and is configured to receive a first input signal 536 and a second input signal 538.

The ideal capacitor 506 is coupled to the first connection 507 and the DC blocking capacitor 524 at a first connection, and the ideal inductor 508 at a second connection. The ideal inductor 508 is coupled to the ideal capacitor 506 at a first connection, and the equivalent series resistor 510 at a second connection. The equivalent series resistor 510 is coupled to the ideal inductor 508 at a first connection, and is coupled to a reference node 511 (for example, a neutral node), the second connection 509, and the resistor 526 at a second connection.

The first connection 507 is coupled to the ideal capacitor 506 and the DC blocking capacitor 524 and is configured to be coupled to at least one external component. Similarly, the second connection 509 is coupled to the equivalent series resistor 510, the reference node 511, and the resistor 526, and is configured to be coupled to at least one external component. For example, where the capacitor 502 illustrates an embodiment of the first capacitor 220, the first connection 507 may be configured to be coupled to the fifth switch 218, and the second connection 509 may be configured to be couple to the fourth switch 216, the second capacitor 222, and the seventh switch 226.

The DC blocking capacitor 524 is coupled to the ideal capacitor 506 and the first connection 507 at a first connection, and is coupled to the resistor 526, the first diode 528, and a non-inverting connection of the comparator 518 at a second connection. The resistor 526 is coupled to the DC blocking capacitor 524, the first diode 528, and the non-inverting connection of the comparator 518 at a first connection, and is coupled to the second connection 509, the equivalent series resistor 510, and the reference node 511 at a second connection.

The first diode 528 is coupled to the DC blocking capacitor 524, the resistor 526, and the non-inverting connection of the comparator 518 at an anode connection, and is coupled to a cathode connection of the second diode 530, the capacitor 532, the resistor 540, and a first input of the adder 534 at a cathode connection. The second diode 530 is configured to receive the first input signal 536 at an anode connection, and is coupled to the cathode connection of the first diode 528, the capacitor 532, the resistor 540, and first input of the adder 534 at a cathode connection. The capacitor 532 is coupled to the cathode connection of the first diode 528, the cathode connection of the second diode 530, and the first input of the adder 534 at a first connection, is coupled to the reference node 511 at a second connection, and is coupled in parallel with the resistor 540. The resistor 540 is coupled to the cathode connection of the first diode 528, the cathode connection of the second diode 530, and the first input of the adder 534 at a first connection, is coupled to the reference node 511 at a second connection, and is coupled in parallel with the capacitor 532.

The adder 534 is coupled to the first diode 528, the second diode 530, the capacitor 532, and the resistor 540 at a first input, is configured to receive the second input signal 538 at a second input, and is configured to be coupled to the delay circuit 516 at an output. The delay circuit 516 is coupled to the adder 534 at an input connection, and is coupled to an inverting connection of the comparator 518 at an output connection.

The comparator 518 is coupled to the DC blocking capacitor 524, the resistor 526, and the first diode 528 at the non-inverting connection, is coupled to the delay circuit 516 at an inverting connection, and is configured to be coupled to the logic circuit 520 at an output connection. The logic circuit 520 is configured to be coupled to the output of the comparator 518 at a first connection, and is configured to be coupled to the output 522 at a second connection.

As discussed above, the shoot-through detector 504 may be configured to detect a shoot-through condition of the capacitor 502 based on a voltage across the capacitor 502. Generally speaking, the shoot-through detector 504 is configured to measure a voltage across the capacitor 502 (i.e., a voltage difference between the first connection 507 and the second connection 509), detect a peak value of the measured voltage, and hold the peak value for a delay period. After the delay period, the shoot-through detector 504 may measure the voltage across the capacitor 502 again to obtain an instantaneous voltage, and compare the instantaneous voltage to the delayed peak voltage. If the instantaneous voltage continuously exceeds the delayed peak voltage by a threshold amount for a threshold amount of time, it may be determined that a shoot-through condition is occurring, and appropriate corrective action may be taken in response thereto.

The determination of the occurrence of the shoot-through condition may be based on a condition where the voltage across the capacitor 502 decreases rapidly during a shoot-through condition. Because the comparison is executed between two capacitor 502 voltage samples collected within a short period of time, the determination of the occurrence of the shoot-through condition can be relatively immune to long-term changes to properties (for example, impedance properties) of the capacitor 502. Accordingly, the shoot-through detector 504 may be more reliable than a shoot-through detector configured to determine whether a capacitor voltage decreases by more than a fixed value (for example, a fixed value determined at a time of manufacture of the capacitor) independent of a previous voltage measurement of the capacitor.

In one example, the shoot-through detector 504 may receive an input voltage at the blocking and sensing circuit 512 indicative of a voltage between the first connection 507 and the second connection 509. The shoot-through detector 504 is configured to filter the input voltage by blocking a DC component of the input voltage (for example, using the DC blocking capacitor 524 of the blocking and sensing circuit 512), and to provide the filtered input voltage to the non-inverting connection of the comparator 518 and the peak detection and hold circuit 514.

The peak detection and hold circuit 514 is configured to detect a peak of the received input voltage, hold the peak voltage for a period of time, and provide an output signal indicative of the peak voltage to the delay circuit 516. The delay circuit 516 holds the output signal for a period of time (for example, 1-2 µs) and, once the period of time has elapsed, provides the output signal to the inverting connection of the comparator 518. In some embodiments, the delay circuit 516 may also include an analog low-pass filter which can be used to generate a signal delay. The comparator 518 compares an instantaneous voltage received at the non-inverting terminal with a delayed output signal received at the inverting connection, and provides an output signal indicative of the comparison.

The output signal is indicative of a relationship between the inputs received at the inverting connection and the non-inverting connection. For example, if the input received at the non-inverting terminal (i.e., the instantaneous voltage) is greater than the input received at the inverting terminal (i.e., a voltage signal derived from the delayed peak voltage), then the comparator 518 will output a signal indicative thereof (for example, a logical HIGH or logical LOW value). Otherwise, if the input voltage received at the non-inverting terminal is less than the input voltage received at the inverting terminal, then the comparator 518 will output a signal having an opposite value (for example, a logical LOW or logical HIGH value).

The logic circuit 520 determines whether the output signal of the comparator 518 has continuously indicated that the instantaneous voltage is greater than the output of the delay circuit 516 for more than a threshold period of time (for example, 500 ns). If so, then the logic circuit 520 may determine that a shoot-through condition is occurring and output a signal to the output 522 indicative of the shoot-through condition. For example, the logic circuit 520 may communicate the signal, via the output 522, to a controller (for example, the controller 236) to automatically address the shoot-through condition. As discussed above, addressing the shoot-through condition may include opening a switching device coupled to the capacitor exhibiting the shoot-through condition.

The peak detection and hold circuit 514 will now be described in greater detail. In some embodiments, the peak detection and hold circuit 514 outputs at least a minimum base value where an input received from the capacitor 502 is less than the minimum base value. The minimum base value is set by the first input signal 536 and may be implemented to avoid false positive detection of a shoot-through condition.

For purposes of explanation only, operation of the peak detection and hold circuit 514 may be regarded as having an idle state and a normal state. Generally speaking, the states may be defined by whether the second diode 530 is reverse-biased (for example, in the normal state) or forward-biased (for example, in the idle state).

In the idle state, the capacitor 532 is substantially discharged and is not being charged by the capacitor 502. In one example, the first input signal 536 is configured to have a sufficiently-large value to forward-bias the second diode 530 at least when the capacitor 532 is substantially discharged. In other examples, the first input signal 536 may be configured to forward-bias the second diode 530 when the capacitor 532 is charged to various partial levels of charge. When the second diode 530 is forward-biased, the first input signal 536 is provided to the first input of the adder 534.

In the normal state, the capacitor 532 is being charged by, or remains at least partially charged from, the capacitor 502.

As will be appreciated by one or ordinary skill in the art, the first diode 528 and the capacitor 532 may act as a peak hold circuit configured to hold a peak of a voltage signal received at the anode of the first diode 528. The second diode 530 remains in a reverse-biased state. The first input of the adder 534 receives an input signal from the capacitor 532 indicative of a most-recently-received peak voltage value across the capacitor 502.

The adder 534 is configured to receive at least one of the first input signal 536 and the signal indicative of the most-recently-received peak voltage value across the capacitor 502 at a first input, and the second input signal 538 at a second input. The adder 534 sums the signals received at the first input and the second input, and outputs the sum to the delay circuit 516.

The second input signal 538 may be implemented to provide a buffer value indicative of an amount by which the instantaneous voltage must exceed the delayed peak voltage for the shoot-through condition to be detected. Stated mathematically, while the peak detection and hold circuit 514 is in the normal state, the comparator 518 will output a signal indicating that a shoot-through condition is detected if, $$V_{instantaneous} > V_{peak} + V_{buffer}$$

where $V_{instantaneous}$ is a voltage measured at the non-inverting connection of the comparator 518, $V_{peak}$ is a most-recently-held peak voltage across the capacitor 502 held by the capacitor 532, and $V_{buffer}$ is a buffer voltage derived from the second input signal 538. Accordingly, the second input signal 538 prevents the comparator 518 from providing a false positive output where $V_{instantaneous}$ exceeds $V_{peak}$ by a negligible amount (i.e., an amount less than $V_{buffer}$), which may occur even where no shoot-through condition is present.

Embodiments of a shoot-through detector described herein can provide shoot-through detection with minimized cost, complexity, and physical footprint relative to the prior art. Moreover, the embodiments described herein are highly configurable. For example, the first input signal 536 and the second input signal 538 may be configured to determine an appropriate balance between shoot-through detection false positives and misses. In one example, a current value corresponding to each of the first input signal 536 and the second input signal 538 is approximately 200 A. In this example, the shoot-through current must be at least 200 A larger than the largest current previously detected during normal operation for a threshold period of time to determine that a shoot-through condition is occurring.

The delay period introduced by the delay circuit 516 may also be configurable. For example, in one embodiment, the delay period introduced by the delay circuit 516 is within a range of 1-2 µs. Similarly, the minimum amount of time during which the comparator 518 must output a signal indicative of the shoot-through condition may be configured via the logic circuit 520.

Furthermore, components of the shoot-through detector 503 may be selected according to various design preferences. For example, in one embodiment, it may be preferable for the capacitor 532 to be selected to have a fast charging time and a slow discharging time. In one example, the capacitor 532 is a 10 nF capacitor having a charging time constant of approximately 0.2 µs and a discharging time constant of approximately 1 ms. Similarly, the comparator 518 may be selected according to various design preferences. In some embodiments, for example, it may be desirable to select a comparator having a minimal propagation delay such that a time between shoot-through detection and shoot-through mitigation or elimination is reduced.

Figure 6:
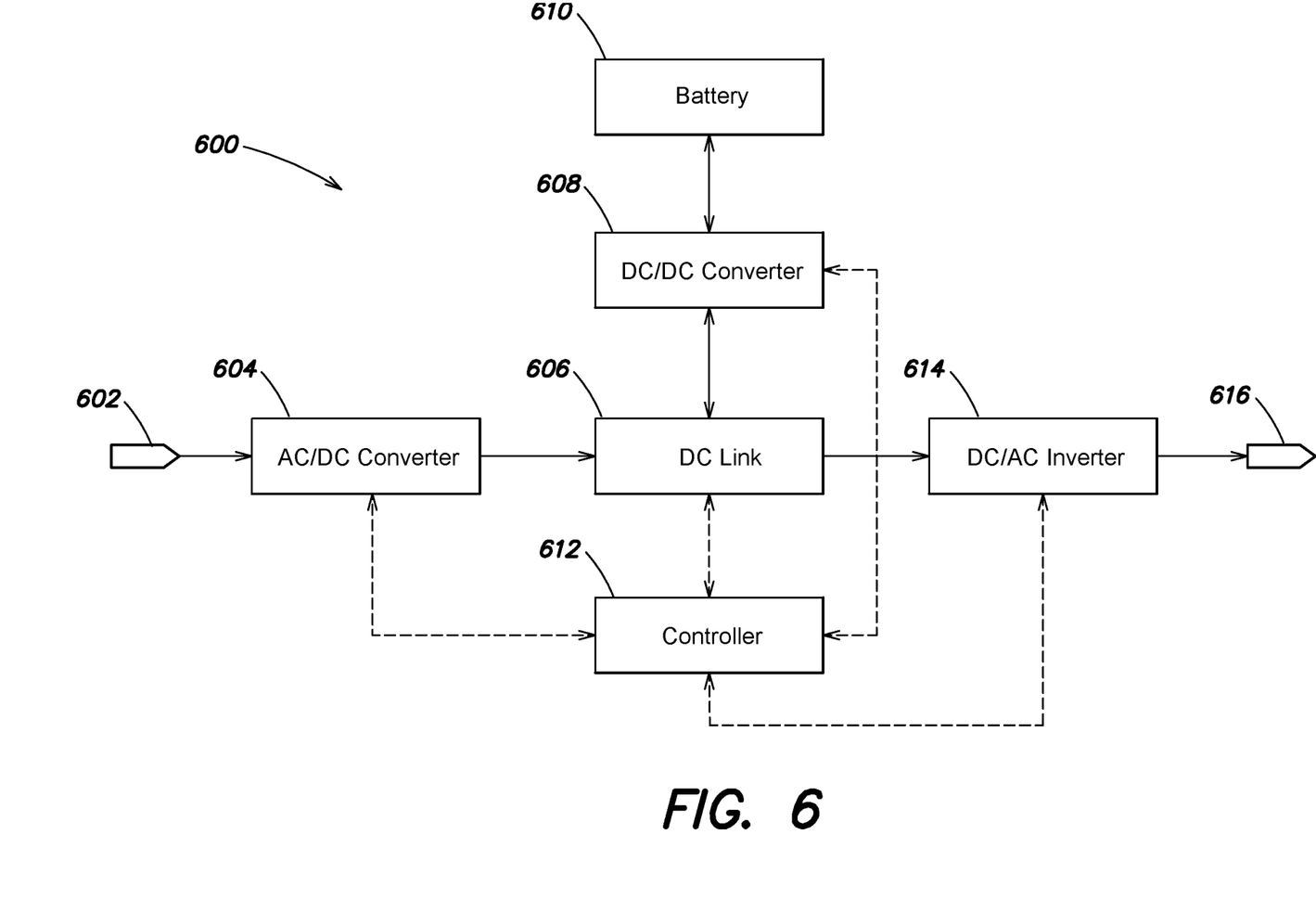
FIG. 6 illustrates a block diagram of an uninterruptible power supply.

As discussed above, at least some of the embodiments described herein may be implemented in Uninterruptible Power Supplies (UPSs). For example, FIG. 6 is a block diagram of a UPS 600. The UPS 600 includes an input 602, an AC/DC converter 604, a DC link 606, a DC/DC converter 608, a battery 610, a controller 612, a DC/AC inverter 614, and an output 616. The input 602 is coupled to the AC/DC converter 604 and an AC power source (not pictured), such as an AC mains power supply. The AC/DC converter 604 is coupled to the input 602 and to the DC link 606, and is communicatively coupled to the controller 612.

The DC link 606 is coupled to the AC/DC converter 604, the DC/DC converter 608, and to the DC/AC inverter 614. The DC/DC converter 608 is coupled to the DC link 606 and to the battery 610, and is communicatively coupled to the controller 612. The battery 610 is coupled to the DC/DC converter 608. The DC/AC inverter 614 is coupled to the DC link 606 and to the output 616, and is communicatively coupled to the controller 612. The output 616 is coupled to the DC/AC inverter 614, and to an external load (not pictured).

The input 602 is configured to be coupled to an AC mains power source and to receive input AC power having an input voltage level. For example, the input 602 may be configured to receive one-phase AC mains power, three-phase AC mains power, or input power having a different number of phases. The UPS 600 is configured to operate in different modes of operation based on the input voltage level of the AC power provided to the input 602. When AC power provided to the input 602 is acceptable (i.e., by having parameters that meet specified values), the UPS 600 operates in a normal mode of operation.

In the normal mode of operation, AC power received at the input 602 is provided to the AC/DC converter 604. The AC/DC converter 604 converts the AC power into DC power and provides the DC power to the DC link 606. The DC link 606 may include one or more energy storage devices (for example, one or more capacitors) configured to store received energy. In some examples, the AC/DC converter 604 may include the rectifier 200, the rectifier 300, and/or the rectifier 400. The DC link 606 distributes the DC power to the DC/DC converter 608 and to the DC/AC inverter 614. The DC/DC converter 608 converts the received DC power and provides the converted DC power to the battery 610 to charge the battery 610. The DC/AC inverter 614 receives DC power from the DC link 606, converts the DC power into regulated AC power, and provides the regulated AC power to the output 616 to be delivered to a load.

When AC power provided to the input 602 from the AC mains power source is not acceptable (i.e., by having parameters that do not meet specified values), the UPS 600 operates in a backup mode of operation. In the backup mode of operation, DC power is discharged from the battery 610 to the DC/DC converter 608. The DC/DC converter 608 converts the received DC power and provides the DC power to the DC link 606. The DC link 606 provides the received power to the DC/AC inverter 614. The DC/AC inverter 614 receives the DC power from the DC link 606, converts the DC power into regulated AC power, and provides the regulated AC power to the output 616.

During the backup mode of operation, power provided to the DC link 606 is provided by the battery 610, and during the normal mode of operation, power provided to the DC link 606 is provided by a power source connected to the input 602. Power provided to the DC link 606 is subsequently drawn by the DC/AC inverter 614 to generate AC power, and to supply the AC power to an external load connected to the output 616. In alternate embodiments, the battery 610 may be replaced by an alternate energy storage device, such as a capacitor or flywheel.

In some embodiments, a shoot-through detection circuit, such as the shoot-through detector 504, may be implemented in connection with one or more components of the UPS 600. For example, a shoot-through detector may be implemented in connection with one or more of the AC/DC converter 604, the DC link 606, or the DC/AC inverter 614.

As discussed above, the shoot-through detector may be implemented in connection with at least one controller, such as the controller 236, the controller 612, or a combination thereof. Using data stored in associated memory, the controller also executes one or more instructions stored on one or more non-transitory computer-readable media that may result in manipulated data. In some examples, the controller may include one or more processors or other types of controllers. In one example, the controller is a commercially available, general purpose processor. In another example, the controller is a Field-Programmable Gate Array (FPGA) controller.

In yet another example, the controller performs a portion of the functions disclosed herein on a processor and performs another portion using an Application-Specific Integrated Circuit (ASIC) tailored to perform particular operations. As illustrated by these examples, examples in accordance with the present invention may perform the operations described herein using many specific combinations of hardware and software and the invention is not limited to any particular combination of hardware and software components.

In some embodiments, one or more controllers may perform one or more of the operations discussed herein. For example, although the first shoot-through detector 221, the second shoot-through detector 223, the shoot-through detector 504, the controller 236, and the controller 612 are illustrated as discrete components, in some embodiments, a single controller may be configured to execute the functionality of each of the foregoing components. For example, the controller 236 may be configured to execute the functionality of the shoot-through detectors 221, 223, 504, including detecting shoot-through in one or more capacitors. In some embodiments, for example, an embodiment of at least one of the shoot-through detectors 221, 223, 504 may be a component of the controller 236.

Having thus described several aspects of at least one embodiment, it is to be appreciated various alterations, modifications, and improvements will readily occur to those skilled in the art. Such alterations, modifications, and improvements are intended to be part of this disclosure, and are intended to be within the scope of the disclosure. Accordingly, the foregoing description and drawings are by way of example only.

What is claimed is:

1. An Uninterruptible Power Supply (UPS) system comprising:
    an input configured to receive input power;
    an interface configured to be coupled to a backup power supply and to receive backup power from the backup power supply;
    an output configured to provide output power derived from at least one of the input power and the backup power to a load;
    a power converter coupled to the input;
    at least one capacitor; and
    a shoot-through detector coupled to the at least one capacitor and being configured to:
    obtain a first voltage value across the at least one capacitor;
    obtain a second voltage value across the at least one capacitor;
    compare the first voltage value to the second voltage value;
    determine, based on the comparison, that the at least one capacitor is experiencing a shoot-through condition; and
    provide an output signal indicative of the shoot-through condition.

2. The UPS system of claim 1, wherein the shoot-through detector comprises a delay circuit configured to delay the first voltage value by a delay period to generate a delayed first voltage value.

3. The UPS system of claim 2, wherein the delay period is within a range of approximately 1-2 microseconds.

4. The UPS system of claim 2, wherein the shoot-through detector further comprises a comparator having:
    a first input configured to receive the delayed first voltage value;
    a second input configured to receive the second voltage value; and
    an output configured to output a signal indicative of a shoot-through condition responsive to determining that the second voltage value is greater than the first voltage value.

5. The UPS system of claim 4, wherein the shoot-through detector further comprises a logic circuit configured to:
    receive, from the output of the comparator, the output signal indicative of the shoot-through condition; and
    output, responsive to receiving the output signal for at least a threshold amount of time, a shoot-through signal indicative of the shoot-through condition.

6. The UPS system of claim 5, wherein the logic circuit is further configured to receive a parameter configuration value to set the threshold amount of time.

7. The UPS system of claim 5, wherein the threshold amount of time is approximately 500 nanoseconds.

8. The UPS system of claim 1, wherein the shoot-through detector further comprises a peak detection and hold circuit configured to receive the first voltage, detect a peak of the first voltage, and hold the peak of the first voltage, the peak of the first voltage corresponding to the first voltage value.

9. The UPS system of claim 1, further comprising a controller coupled to the shoot-through detector,
    wherein the shoot-through detector is further configured to provide the output signal to the controller, and
    wherein the controller is configured to control at least one switching device coupled to the at least one capacitor to be in an open and non-conducting position in response to receiving the output signal.

10. An Uninterruptible Power Supply (UPS) system comprising:
    an input configured to receive input power;
    an output configured to provide output power to at least one load;
    at least one capacitor coupled to at least one switching device; and
    means for determining, based on a comparison of a first voltage across the at least one capacitor and a second voltage across the at least one capacitor, a shoot-through condition is present in the at least one capacitor.

11. The UPS system of claim 10, further comprising means for operating the at least one switching device to mitigate the shoot-through condition.

\* \* \* \* \*